United States Patent
Miyazaki

(10) Patent No.: US 6,844,269 B2
(45) Date of Patent: Jan. 18, 2005

(54) ETCHING METHOD FOR SEMICONDUCTOR SILICON WAFER

(75) Inventor: Seiichi Miyazaki, Kosyoku (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 191 days.

(21) Appl. No.: 09/913,334

(22) PCT Filed: Dec. 25, 2000

(86) PCT No.: PCT/JP00/09185
§ 371 (c)(1),
(2), (4) Date: Aug. 13, 2001

(65) Prior Publication Data
US 2003/0008504 A1 Jan. 9, 2003

(30) Foreign Application Priority Data
Dec. 28, 1999 (JP) .......................... 11-374052

(51) Int. Cl.[7] .......................................... H01L 21/306
(52) U.S. Cl. .................... 438/753; 216/2; 216/93; 216/99
(58) Field of Search ................ 216/93, 2, 99; 257/E21.219; 438/753

(56) References Cited

U.S. PATENT DOCUMENTS 4,758,368 A * 7/1988 Thompson ................ 252/79.5

FOREIGN PATENT DOCUMENTS

| EP | 0 864 533 A2 | 9/1998 |
|---|---|---|
| JP | A 3-1537 | 1/1991 |
| JP | A 5-291238 | 11/1993 |
| JP | A 10-310883 | 11/1998 |
| JP | A 11-162953 | 6/1999 |
| JP | A 2001-68444 | 3/2001 |

* cited by examiner

Primary Examiner—George Fourson
(74) Attorney, Agent, or Firm—Oliff & Berridge, PLC

(57) ABSTRACT

An etchant and an etching method that contribute to prevention of metal contamination of a semiconductor silicon wafer, and a semiconductor silicon wafer in which metal contamination is extremely reduced, are provided. The etchant according to the present invention is prepared by immersing stainless steel in an alkali aqueous solution for not less than 10 hours. In the etching method according to the present invention, a semiconductor silicon wafer is etched by using the etchant. Thereby, the semiconductor silicon wafer according to the present invention, in which metal contamination is extremely reduced, is obtained.

1 Claim, 2 Drawing Sheets (a)

(b)

US 6,844,269 B2

ETCHING METHOD FOR SEMICONDUCTOR SILICON WAFER

TECHNICAL FIELD

The present invention relates to a semiconductor material, particularly, to an etchant, an etching method of a silicon wafer, and a semiconductor silicon wafer.

BACKGROUND ART

A silicon wafer passed through machining processes of block cutting, outer diameter grinding, slicing, and lapping, has a damaged layer, that is, an process damage layer, on the surface. In a manufacturing process of devices, since the process damage layer induces a crystal defect, such as slip dislocation, lowers mechanical strength of a wafer, and also affects adversely on electrical characteristic, it is required to be removed completely.

Conventionally, removing the process damage layer, which is introduced into a silicon wafer in the machining processes, by chemical etching, is carried out. As methods of the chemical etching, there are acid etching and alkali etching. Among these, the alkali etching has few problems in occurrence of a harmful by-product, such as $NO_x$ in the acid etching, and little danger when handling, and costs can also be reduced from the fields of material expense and equipment expense. Therefore, as an etching method, the alkali etching is preferable.

In the alkali etching of a silicon wafer, generally, an aqueous solution of sodium hydroxide is used. However, in the aqueous solution of sodium hydroxide for industry or for electronics industry, the present condition is that several ppm to tens ppm of metal impurities are included in the solution for industry and tens ppb to several ppm of metal impurities are included even in the solution of the grade for electronics industry.

As metal impurities included in the alkali aqueous solution, iron, nickel, chromium, and copper or the like, are given.

Therefore, as a material of an etching vessel, for example, even if it is the case that polypropylene is used in consideration of corrosion resistance, the silicon wafer is contaminated by the iron, nickel, chromium, and copper or the like, which are included in the alkali aqueous solution. In order to suppress that the metal impurities included in the alkali aqueous solution adhere to the silicon wafer in this way, the amount of metal ions dissolved in the alkali aqueous solution, is reduced by dissolving silicon in the alkali aqueous solution beforehand, by dissolving hydrogen gas (Japanese Patent Application Laid-open No. Hei 9-129624), by using an ion-exchange resin (Japanese Patent Application Laid-open No. Hei 9-129624), or by dissolving a dithionite or the like (Japanese Patent Application Laid-open No. Hei 10-310883), and methods for etching a silicon wafer by these solutions are proposed. However, even by these methods, the amount of contamination of the metallic elements adhering to or being diffused inside an etched wafer, is still a problem for manufacturing the latest high integration device. Therefore, its further reduction is required.

The present invention was made in view of the above-described problem. An object of the present invention is to provide an etchant and an etching method that contribute to prevention of metal contamination of a semiconductor silicon wafer, and a semiconductor silicon wafer in which metal contamination is extremely reduced.

DISCLOSURE OF INVENTION

According to a first aspect of the present invention, an etchant of the present invention is prepared by immersing stainless steel in an alkali aqueous solution for not less than 10 hours. Metallic elements dissolved in such etchant are extremely reduced.

As the alkali aqueous solution, an aqueous solution of general alkali, such as lithium hydroxide, potassium hydroxide, or sodium hydroxide or the like, can be used similarly. However, a sodium hydroxide aqueous solution is preferable to be used for economical reason. The concentration of not less than 40% by mass, much preferably, not less than 45% by mass, is effective, in view of an etch rate. However, in order to heighten the concentration, it is required to evaporate water from the alkali aqueous solution, which is marketed generally. Therefore, from economical viewpoint, the concentration of not more than 60% by mass, much preferably, not more than 55% by mass, is useful.

Further, as a kind of stainless steel used for preparing the etchant, although it is not required to be specified, it is sufficient if most general SUS304 or SUS316 is used practically.

As for preparation of the etchant, the temperature is preferable to be not less than 70° C. Much higher temperature is further preferable, so that not less than 80° C. is effective. On the other hand, from that energy for heating is required in order to make high temperature, and from consideration on safety, not more than 90° C., further, not more than 87° C., is preferable.

The basis of reducing of the concentrations of metal ions in an alkali aqueous solution by immersing stainless steel, is uncertain. However, it is inferred that it is because the ions are absorbed onto or occluded into a passive state film formed on the surface of the stainless steel in the alkali aqueous solution. Therefore, the effect of reducing the concentration of the metal ions in the alkali aqueous solution depends on the surface area of the stainless steel, and its value is preferable to be not less than 20 cm$^2$ per 1 liter of the alkali aqueous solution. Moreover, as being clear from FIG. 1, the longer immersing time in the alkali aqueous solution, the larger reducing effect is. However, the rate of reduction of the concentrations of the metal ions in the solution decreases with passage of time. The contact surface of SUS with solution presents black blue, and the concentrations of the metal ions in the solution is converged on a constant value. Therefore, the material of SUS is preferable to have a fresh metal surface.

In the alkali etchant according to the present invention, the concentrations of the iron, nickel, chromium, and copper in the etchant decrease, compared with the alkali etchant without immersing SUS304 or SUS316. As a result, metal contamination of an etching object, for example, a semiconductor wafer, can be reduced, when etching.

With the alkali etchant according to the present invention, the metal ions existing in the alkali aqueous solution can be unionized by dissolving a reducing agent having a lower oxidation potential compared with the reversible potential of the metal ions existing in the alkali aqueous solution. That is, the metal ions are reduced because the oxidation-reduction potential of the metal ions in the solution may be lower than the oxidation-reduction potential of the reducing agent. Thereby, the amounts of metals residing in the etchant as ions are reduced, so that adhesion of the metal ions to a wafer surface is suppressed. Therefore, the reducing action of the reducing agent is further overlapped with the adsorption deionization effect by the immersion of the stainless steel, so that the effect of further suppression of adhesion of the metal ions to the wafer is exhibited.

As the above-described reducing agent, a strong reducing agent with a very low oxidation potential, for example, hypophosphite, dithionite, boron hydride compound, aldehyde genera, and hydrazine compound or the like, can be given, and these can be used in either a sole or a mixed state. By dissolution of the reducing agent, an etchant of a semiconductor material, in which the concentration of the heavy metal ions is not more than $3\times10^{-6}\%$ in mass basis, is obtained.

The amount of addition of the above-described reducing agent changes with the kind of the reducing agent. Although there is no special limitation as long as the effect of the present invention is attained, in the case of dithionite, not less than 2.5 g/liter is preferable. When this amount of dissolution is too little, the effect of the present invention becomes insufficient. When the amount of dissolution is too much, it is disadvantage from an economical viewpoint.

The alkali etchant of the present invention can be the one in which silicon is dissolved. By the dissolution of silicon, an etchant of a semiconductor material, in which the concentrations of the heavy metal ions are not more than $3\times10^{-6}\%$ in mass basis, is obtained. Furthermore, by dissolution of the reducing agent and silicon, an etchant in which any one of the concentrations of iron ion, copper ion, nickel ion, and chromium ion is not more than $5\times10^{-7}\%$ in mass basis, is obtained.

As a material used for dissolving silicon, besides a poly crystal or a single crystal of silicon, a silicon compound is given. As a silicon compound of the latter, silica or silicate glass can be given, and these may be used in either a sole or a mixed state. In addition, as for these metal silicon or silicon compound, a high purity one in a range that balances in cost, is preferable to be used. Although there is no special limitation in the amount of dissolution of silicon into the alkali solution as long as the effect of the present invention is attained, not less than 2 g/liter is preferable. When this amount of dissolution is too little, the effect of the present invention becomes insufficient. When the amount of dissolution is too much, it is disadvantage from an economical viewpoint.

In the alkali etchant, by the reaction product of hydrogen or silicate or the like, which occurs when the silicon material is dissolved, the metal ions in the solution are reduced, or bonded to the silicate or the like, so that the amounts of residing as ions are reduced. This will further heighten the effect of immersing stainless steel or the effect of adding a reducing agent.

The etchant of the present invention is prepared in a container. At least the portion of the container that is in contact with the alkali solution is made from an alkali resistant material, for example, polypropylene. Thereby, since there is little elution of metallic elements from the material of the container, consequently, it is effective for suppressing adhesion of the metal ions to a wafer without rising of the concentrations of the metal ions in the alkali aqueous solution.

In addition, preparation of the etchant also can be made in a container made from SUS having a fresh metal surface. In this case, the time that the sodium hydroxide solution resides in the container made from SUS, is required to be not less than 10 hours. However, as described later, since the rate of reduction of the concentrations of the metal ions decreases even if the residence time is too long, it is preferable to be within about 20 hours.

According to a second aspect of the present invention, an etching method of the present invention is the one that etching of a semiconductor silicon wafer is carried out by using the above-described etchant. According to the etching method, metal contamination of the semiconductor silicon wafer is prevented effectively.

According to a third aspect of the present invention, the semiconductor silicon wafer of the present invention is a semiconductor silicon wafer that the amounts of metallic elements, which include at least one of iron, nickel, chromium, and copper adhering to the surface after etching in the alkali aqueous solution, is suppressed by not more than $1\times10^{10}$ atoms/cm$^2$. The semiconductor silicon wafer can be obtained stably for the first time by the above-described method. Particularly, any amount of adhesion of iron, nickel, chromium, and copper on the surface can be suppressed by not more than $5\times10^8$ atoms/cm$^2$.

PREFERRED EMBODIMENT OF THE INVENTION

Example

Figure 1:
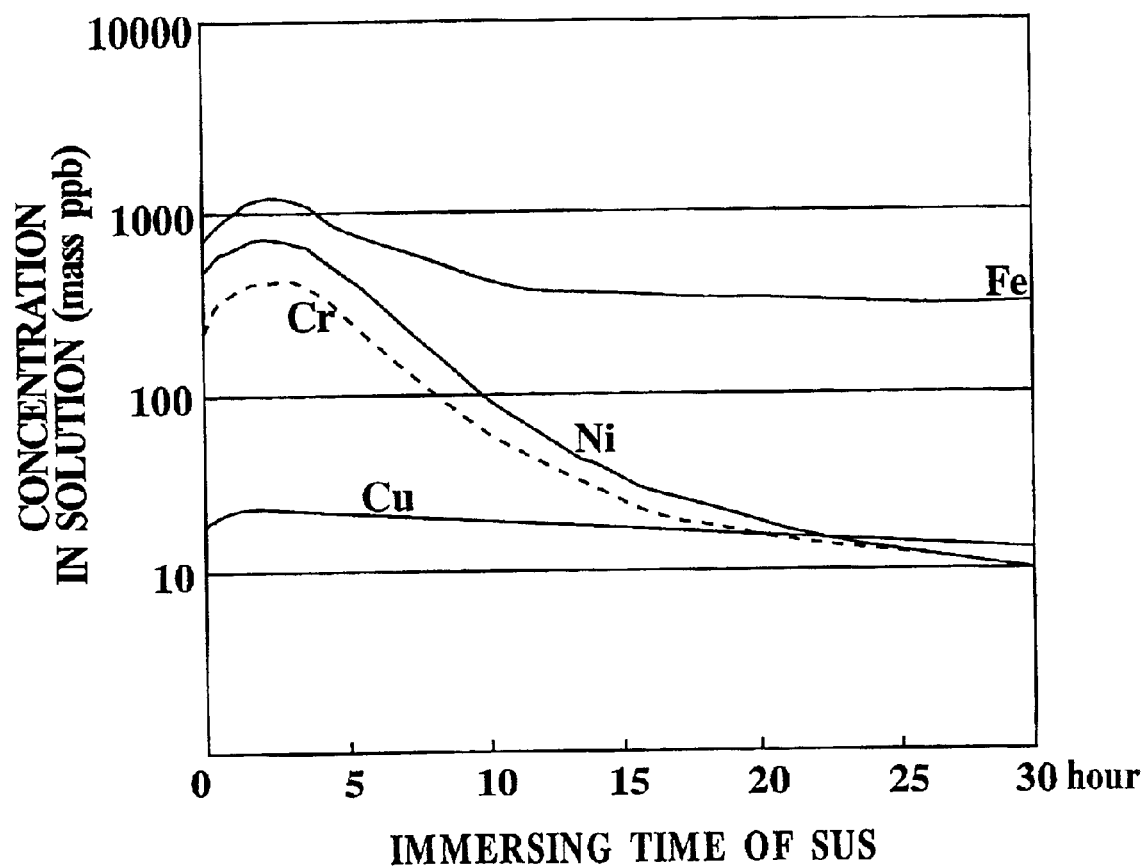
FIG. 1 is a view showing measured results of concentrations of Fe, Ni, Cr, and Cu ions in a sodium hydroxide aqueous solution, to which SUS immersing treatment is made, to immersing time of SUS.

1. Method for Preparing Etchant (1) Treatment of Immersing Stainless Steel in Etchant Into a tank made from polypropylene, 20 liters of sodium hydroxide (45% by mass for industry) was put in. After raising temperature to a predetermined temperature (85° C.), while keeping at 85±1° C., a plate (30 cm in length, 10 cm in width, and 0.2 mm in thickness) of SUS316 having a fresh metal surface was immersed so that both surfaces thereof would be in contact with the sodium hydroxide aqueous solution. Then, after a predetermined time is passed, the SUS316 was taken out.

(2) Adding Dithionite

A predetermined amount (100 g) of sodium dithionite was added to the sodium hydroxide aqueous solution, which was prepared in said (1) by treatment of immersing SUS, and dissolved therein.

(3) Dissolving Silicon

A predetermined amount (100 g) of Si was added to the sodium hydroxide aqueous solution, which was prepared in said (1) by treatment of immersing SUS, and dissolved therein.

In addition, when carrying out the treatment of immersing SUS, the addition and dissolution of a reducing agent, and the addition and dissolution of Si to the sodium hydroxide aqueous solution, it is preferable to carry out to the temperature raised one.

2. Etching Method of Wafer and Experimental Condition

1) Sample of wafer: CZ, p-type, and lapping finished wafer of <100>

2) Etching: etching immersion

| sample | 40 pieces |
|---|---|
| temperature | 80 ± 1° C. |
| time | 10 minutes |

3) Cleaning: a) Rinsing by-pure water:
   three staged cleaning in an over flow type water vessel at amount of supplied pure water of 30 to 50 liters/minute
   impressing ultrasonic waves of 800 to 1000 W to each vessel

| temperature | 10 to 15° C. |
|---|---|
| time | 3 to 5 minutes | b) Cleaning by hydrochloric acid-hydrogen peroxide water
   composition (30% by mass $H_2O_2$:36% by mass HCl:pure water=1:1:10)

| temperature | 80 ± 1° C. |
|---|---|
| time | 3 minutes |

4) Drying: spin drying

3. Method for Measuring Concentrations of Metal Ions in Etchant

From the etchant, 10 ml of sample was taken out and diluted 45 times, so that a solution was made. Then, 10 ml of sample was taken out from the solution. The amount of each metal ion was determined by ion chromatography, using the sample taken out from the solution, and the concentration of each metal ion in the alkali solution was calculated from the determined value.

4. Method for Measuring Amounts of Metal Ions Adhered to Wafer

After treatment of sand blasting to one surface of the sample wafer was carried out, it was heated to 600° C., so that a surface silicon oxide film was formed. The silicon oxide film formed on the surface to which the treatment of sand blasting was carried out, was decomposed and removed by vapor containing hydrogen fluoride. Since heavy metal elements in the silicon oxide film remain on the wafer surface, the heavy metal elements on the wafer surface were collected by using 200 μl of a 1% hydrofluoric acid solution. Then, 20 μl of sample was taken out from this collected solution, and each metallic element in the sample was analyzed and determined by ICP-MS (inductively coupled plasma mass spectrometry) method, and amount of adhesion (atom/cm$^2$) of each metal ion was calculated from the determined value.

(Experiment 1)

The effect of reduction of metal ion concentrations in an etchant by immersion of SUS, was studied. That is, the immersing time of SUS for immersing in a sodium hydroxide aqueous solution was made into 2, 4, 8, 10, 12, 15, 20 and 30 hours, respectively. Then, the concentrations of Fe, Ni, Cr, and Cu ions in each sodium hydroxide aqueous solution to which the SUS immersing treatment was made, were measured. The results are shown in FIG. 1.

As shown in FIG. 1, when the immersing time of SUS is at least 10 hours, preferably, 12 hours or more, it is known that the reducing effect of concentrations of the metal ions in the solution is very remarkable to Fe, Ni, and Cr, and also effective to Cu. When the time is lengthened more than that, the effect is recognized further. However, since the effect is reduced gradually, an appropriate time of 10 hours or more, practically, may be chosen according to need. Therefore, in all of the examples and the comparative examples hereinafter, the immersing time of 12 hours was used.

Example and Comparative Example

The reducing effect of-metal ions in a solution by immersion of SUS was compared and studied at the conditions shown in Table 1.

TABLE 1

| Experiment No. | | Prepared solution | Temperature |
|---|---|---|---|
| 1 | Example 1 | sodium hydroxide + SUS immersion | 85 ± 1° C. |
| 2 | 2 | sodium hydroxide + SUS immersion + $Na_2S_2O_4$ | 85 ± 1° C. |
| 3 | 3 | sodium hydroxide + SUS immersion + Si | 85 ± 1° C. |
| 4 | 4 | sodium hydroxide + SUS immersion + $Na_2S_2O_4$ + Si | 85 ± 1° C. |
| 5 | Comparative example 1 | sodium hydroxide | 85 ± 1° C. |
| 6 | 2 | sodium hydroxide + $Na_2S_2O_4$ | 85 ± 1° C. |
| 7 | 3 | sodium hydroxide + Si | 85 ± 1° C. |

Figure 2:
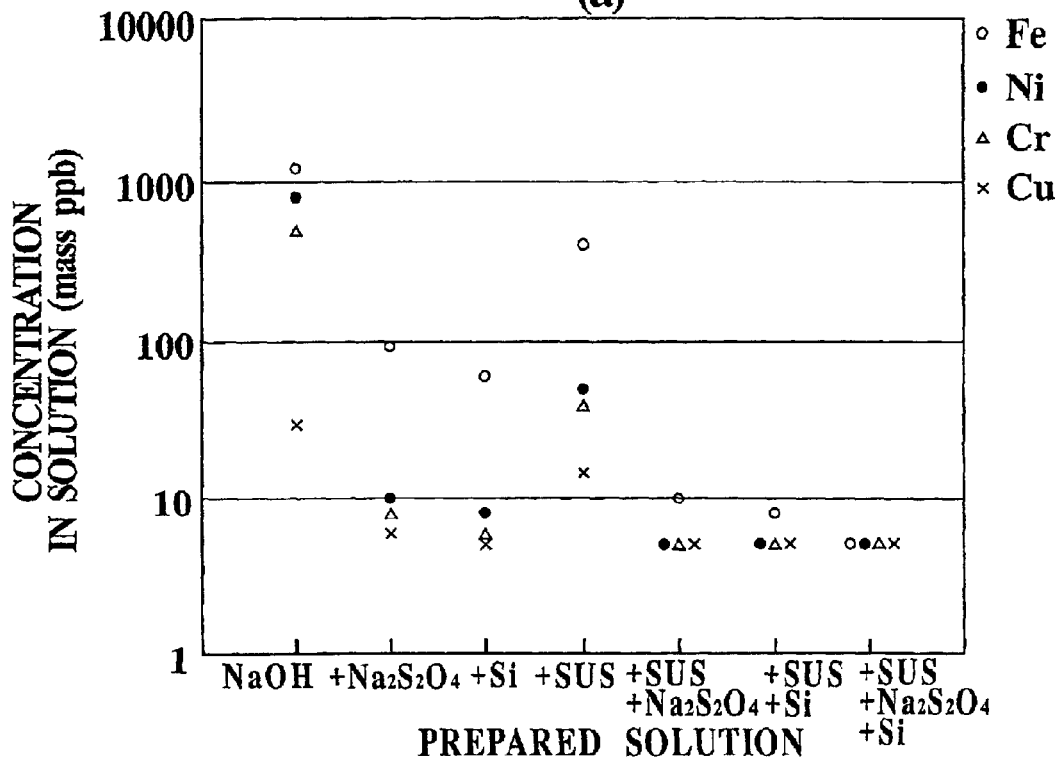
FIG. 2(a) is a view showing concentrations of metal ions residing in a prepared solution.
FIG. 2(b) is a view corresponding to FIG. 2(a), showing measured values of amount of adhesion of the metal ions to a wafer surface.
Figure 2:
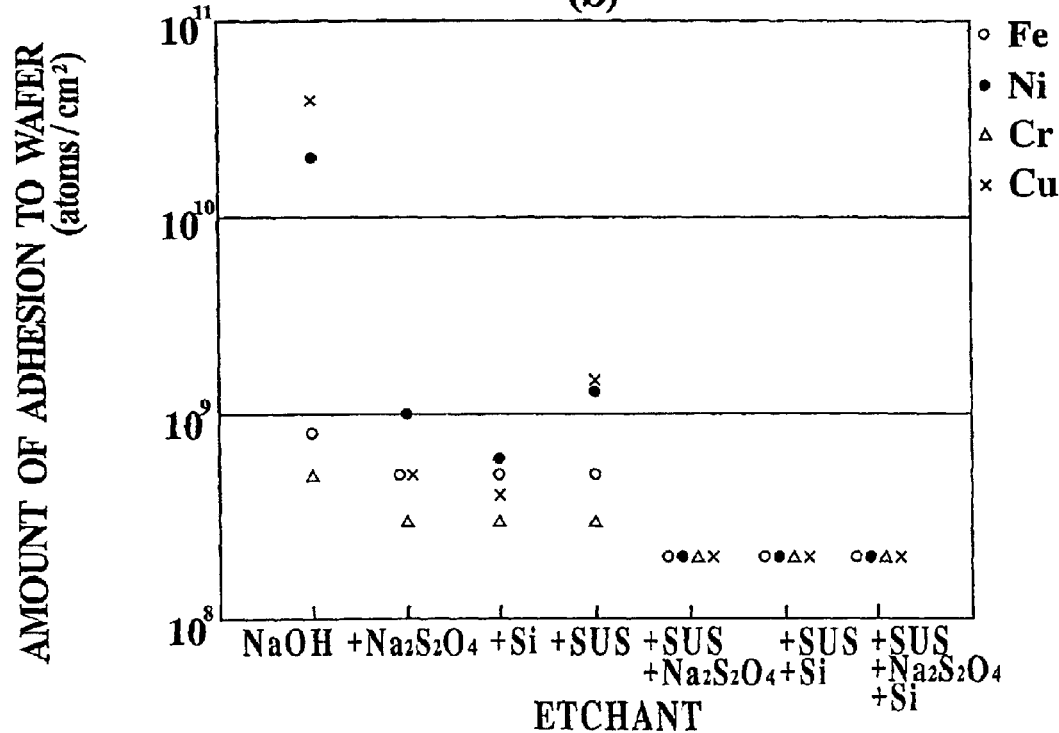

The results are shown in Table 2 and FIG. 2(a). As shown in FIG. 2(a), with the concentrations of the metal ions residing in the solutions, the concentrations of the metal ions are decreased by immersing SUS in the sodium hydroxide solution. Further, by adding $Na_2S_2O_4$ or Si, with the synergistic effect of immersion of SUS, much more reducing effect than the effect of $Na_2S_2O_4$ or Si only was recognized. Therefore, the concentrations of heavy metal ions can be made not more than $3 \times 10^{-6}\%$ in mass basis (30 mass ppb). When both $Na_2S_2O_4$ and Si are added, the effect is still more remarkable, so that all of Fe, Ni, Cr, and Cu can be made not more than $5 \times 10^{-7}\%$ in mass basis (5 mass ppb).

There is no particular limit in the order of the SUS immersion treatment, the addition of the reducing agent, and the addition of Si. The effect is the same even if each of the treatment operations is carried out by an arbitrary order or at the same time.

TABLE 2

| Experiment | Concentration in solution (mass ppb) | | | | Amount of adhesion to wafer ($10^8$ atoms/cm$^2$) | | | |
|---|---|---|---|---|---|---|---|---|
| No. | Fe | Ni | Cr | Cu | Fe | Ni | Cr | Cu |
| 1 | 400 | 50 | 40 | 15 | 5 | 13 | 3 | 15 |
| 2 | 10 | <5 | <5 | <5 | <2 | <2 | <2 | <2 |
| 3 | 8 | <5 | <5 | <5 | <2 | <2 | <2 | <2 |
| 4 | <5 | <5 | <5 | <5 | <2 | <2 | <2 | <2 |

TABLE 2-continued

| Experiment | Concentration in solution (mass ppb) | | | | Amount of adhesion to wafer ($10^8$ atoms/cm$^2$) | | | |
|---|---|---|---|---|---|---|---|---|
| No. | Fe | Ni | Cr | Cu | Fe | Ni | Cr | Cu |
| 5 | 1200 | 800 | 500 | 30 | 8 | $2 \times 10^2$ | 5 | 400 |
| 6 | 90 | 10 | 8 | 6 | 5 | 10 | 3 | 5 |
| 7 | 60 | 8 | 6 | 5 | 5 | 6 | 3 | 4 |

FIG. 2(b) is corresponding to FIG. 2(a), showing the measured values of the amounts of adhesion of the metal ions to a wafer surface when a silicon wafer was etched by using each etchant. The effect of immersing SUS in the sodium hydroxide aqueous solution can be recognized evidently. Further, the effect is facilitated by adding $Na_2S_2O_4$ or Si. When both $Na_2S_2O_4$ and Si are added, for example, as seen in Fe, since the reducing effect of concentrations of the heavy metal ions in the sodium hydroxide aqueous solution is further facilitated (Table 2 and FIG. 2(a)), it can be considered that the amounts of adhesion of the heavy metals to the wafer surface is still more reduced, in view of its dependency to the concentrations of the heavy metal ions in the solution. In any case, all of Ni, Cr, Cu, and Fe were not more than the detection limit of the used analysis method, so that the amounts of adhesion of the heavy metals to the wafer surface could be made into not more than $1 \times 10^{10}$ atoms/cm$^2$, and the amounts of adhesion of all of Fe, Ni, Cr, and Cu on the surface could be made into not more than $5 \times 10^8$ atoms/cm$^2$.

INDUSTRIAL APPLICABILITY

As described above, according to the present invention, an etchant and an etching method that can prevent effectively metal contamination of a semiconductor silicon wafer can be realized, and a semiconductor silicon wafer, in which metal contamination is extremely reduced, can be obtained. Therefore, the ethcant and the etching method of the present invention are particularly suitable for etching a semiconductor material, in particular, a silicon wafer.

What is claimed is:

1. An etching method comprising the step of etching a semiconductor silicon wafer by using an etchant prepared by immersing stainless steel in an alkali aqueous solution for not less than 10 hours.

* * * * *